(12) United States Patent
Delapierre et al.

(10) Patent No.: US 7,919,046 B2
(45) Date of Patent: Apr. 5, 2011

(54) METHOD FOR GRAFTING MOLECULES OF INTEREST ON INORGANIC SURFACES, RESULTING SURFACES AND USES THEREOF

(75) Inventors: Guillaume Delapierre, Vif (FR); Florence Duclairoir, Grenoble (FR); Jean-Claude Marchon, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 273 days.

(21) Appl. No.: 12/091,577

(22) PCT Filed: Oct. 25, 2006

(86) PCT No.: PCT/FR2006/002395
§ 371 (c)(1),
(2), (4) Date: Aug. 22, 2008

(87) PCT Pub. No.: WO2007/048924
PCT Pub. Date: May 3, 2007

(65) Prior Publication Data
US 2009/0188602 A1    Jul. 30, 2009

(30) Foreign Application Priority Data
Oct. 27, 2005   (FR) ..................... 05 10987

(51) Int. Cl.
*B05D 3/10* (2006.01)
(52) U.S. Cl. ............. 422/83; 427/301; 427/337; 438/49
(58) Field of Classification Search .................. None
See application file for complete search history.

(56) References Cited

U.S. PATENT DOCUMENTS

| | | | |
|---|---|---|---|
| 6,358,613 B1 | 3/2002 | Buriak | |
| 6,569,979 B1 | 5/2003 | Strother et al. | |
| 2006/0063178 A1* | 3/2006 | Rauh-Adelmann et al. | 435/6 |
| 2006/0063852 A1* | 3/2006 | Iwata et al. | 523/106 |
| 2009/0082222 A1* | 3/2009 | Cai et al. | 506/16 |

OTHER PUBLICATIONS

"Functionalization of Acetylene-Terminated Monolayers on Si(100) Surfaces: a Click Chemistry Approach" authored by Ciampi et al., and published in Langmuir 2007, 23, 9320-29.*
"PEGylation of Porous Silicon using Click Chemistry", Langmuir (2008), 24(15), p. 7625-7627.*
"A New Bio-active Surface for Protein Immobilization via Copper-free Click" between Azizo SAM and alkynyl Fischer Carbene Complex, Chem. Comm. (2008) p. 5957-5959.*
"A Non-oxidative Approach toward Chemically and Electrochemically Functionalizing Si(111)", JACS (2006), 128, 9518-9525.*
Yin, H.B. et al., "Submicron Pattering of DNA Oligonucleotides on Silicon", Nucleic Acids Research,vol. 32, No. 14, pp. e118 1-e118 7, XP002393285, 2004.
Schmeltizer, J.M. et al., "Functionalization of Porous Silicon With Alkenes and Alkynes Via Carbocation-Mediated Hydrosilylation", Materials Research Society, vol. 737 pp. F4.5.1-F4.5.6, XP002393286, 2003.
Sharpless, K.B. et al., "Click Chemistry Olefins, Spring-Loaded Electrophoresis, and Heteroatom Connections Are Key Elements in a Fast, Modular, Process-Driven Approach to Molecular Discovery", Angewandte Chemie, vol. 40, pp. 2004-2021, XP001206265, 2001.
Rostovtsev et al., "A Stepwise Huisgen Cycloaddition Process: Copper (I)-Catalyzed Regioselective "Litigation" of Azides and Terminal Alkynes", Angewandte Chemie, vol. 41, No. 14, pp. 2596-2599, XP002331267, 2002.
Tornoe, C. W. et al., "Peptidotriazoles on Solid Phase [1,2,3]-Triazoles by Regiospecific Copper (I) Catalyzed 1, 3-Dipolar Cycloadditions of Terminal Alkynes to Azides", Journal of Organic Chemistry, vol. 67, No. 9, pp. 3057-3064, XP002234501, 2002.
Alvarez, S.G. et al., "A Practical Procedure for the Synthesis of Alkyl Azides At Ambient Temperature in Dimethyl Sulfoxide in High Purity and Yield" Synthesis, vol. 413, pp. 413-414, XP002394856, 1997.
Han, S.W. et al., "Self-Assembled Monolayers of Azobenzene-Incorporated Alkanethiol on Silver", Bulletin of the Korean Chemical Society, vol. 26, No. 3, pp. 463-466, XP002394857, 2005.

* cited by examiner

*Primary Examiner* — Marc S Zimmer
(74) *Attorney, Agent, or Firm* — Oblon, Spivak, McClelland, Maier & Neustadt, L.L.P.

(57) ABSTRACT

The invention concerns a method for grafting molecules of interest on a silicon substrate via a spacer compound, said grafting including at least one click chemistry reaction to the supports thus obtained as well as their uses in nanotechnologies and nanobiotechnologies, such as molecular electronics, the manufacture of biochips or of sensors.

18 Claims, 1 Drawing Sheet

METHOD FOR GRAFTING MOLECULES OF INTEREST ON INORGANIC SURFACES, RESULTING SURFACES AND USES THEREOF

The present invention relates to the grafting of molecules of interest onto an inorganic substrate, in particular a silicon substrate, via a spacer, said grafting using at least one click chemistry reaction, to the surfaces thus grafted and to the applications thereof in nanotechnology and nanobiotechnology fields, such as molecular electronics or the fabrication of biochips or of sensors.

Methods for miniaturizing electronic components are today reaching their limits and a great deal of effort is being spent on finding one or more techniques for reducing the size of the current components, which appear to have become obsolete. For this reason, systems that operate completely differently must be proposed.

The studies carried out in the field of molecular electronics are along these lines, and a great deal of research is initiated in order to develop novel "all molecular" or "hybrid" (for example: silicon/organic molecules) microelectronic devices. Moreover, subsequent to these many studies carried out in parallel, these new miniaturization approaches also find other fields of application, such as biotechnologies. In fact, in addition to answering the question of the miniaturization of electronic components, these novel systems could allow, or could be adapted to, the fabrication of medical images, receptors, or else molecular transporters of nanoscopic sizes that can be ingested by the patient.

These novel devices very commonly require the anchoring of a molecule or of an element of nanometric size on a surface in order to use the system in a completely solid form. Silicon surfaces are very widely used in the current research studies since the properties of this material are known, in particular by virtue of the use made of them in the electronics field.

This field has been fast-expanding for about ten years and several grafting techniques can be listed. Some are direct, others are indirect, i.e., after the surface preparation phase, the grafting of the desired molecule requires one or more further steps. Numerous surfaces have been studied: gold, silica ($SiO_2$), silicon, graphite and platinum. The specificity of each grafting technique is based on the material on which the experiment is attempted and also on the number of steps carried out and on the chemistry used.

In the electronics field, silicon surfaces are often coated with a layer of oxide having insulating properties. Few examples involve grafting onto silicon directly. However, grafting directly onto silicon can have advantages, such as avoiding the presence of a layer of oxide which increases the dimensions of the device, or which may screen the molecule of the semiconducting silicon.

Surfaces of natural silicon are, moreover, of major interest in the electronics field and methods other than those disclosed above have been developed in order to modify them.

Thus, certain authors, such as Menzel H. et al., Langmuir, 1997, 13(4), 723-728, propose a method for modifying a silicon surface with polyglutamate using a spacer. The surface should first of all be cleaned by various treatments which generate superficial Si—OH bonds, and then the spacer, a trichlorosilylated bromoalkane, is anchored via Si—O—Si bonds with the surface. Treatment of the surface thus obtained, with a solution of $NaN_3$, makes it possible to substitute azides for the bromine atoms, said azides subsequently being reduced with $LiAlH_4$. The latter reaction makes it possible to obtain a hydrosilylated surface coated with aminoalkanes. N-carboxyanhydride benzylglutamate is then grafted by reaction with the $NH_2$-terminal groups on the surface. The degree of coverage of the surface has been estimated at 20-40%. This method remains, however, relatively restricted due to the laborious preparation of the surface and due to the number of steps required to carry out the anchoring of the polyglutamate.

The natural silicon surfaces, in addition to cleaning, can undergo preparation steps before the grafting of the compounds of interest. Thus, Effenberger F. et al., Langmuir, 2004, 20(24), 10375-10378, describe a grafting method consisting in modifying a silicon surface in order to have thereon free hydroxyl groups which react with trichlorosilanes; the method is illustrated by the grafting of long-chain esters which are stable under the reaction conditions. The ester functions are subsequently reduced to alcohol functions and then, after reaction with phosgene, the corresponding chloroformates are obtained. A chlorine substitution reaction in the presence of $NaN_3$ is then carried out in order to produce the corresponding azidoformate. Exposure of this surface to UV radiation results in the elimination of the nitrogen so as to form a surface ending with a carbamate. Another modification that can be envisioned is a nucleophilic substitution on the electrophilic carbamate with an aminated molecule. According to this method, an activated surface is obtained, which it is then possible to react with molecules of interest that have functions capable of adding on to the amines or the carbamates. This protocol, which is close to that proposed by Menzel H. et al. (mentioned above) is, however, tricky to implement since it requires the use of phosgene and represents a large number of steps. Moreover, the proposed functionalization, although it can produce two different results, does not make it possible to graft very varied molecules other than amines. The degree of coverage is estimated at 73-78%.

Other authors, such as Sudhölter E. J. R. et al., (Langmuir, 1999, 15(23), 8288-8291), propose a thermal method of surface functionalization using hexadecane. The operating conditions, particularly the high temperature, imply the use of specific solvents. These relatively drastic conditions do not appear to be compatible with labile or unstable groups and do not offer any perspective to this method. The authors mention a second method, which requires modification of the natural silicon surface by substitution of the hydrogen atoms present with chlorine or bromine atoms. The desired modified surface is then obtained by reaction of an organomagnesium compound or of an organolithium compound. The degrees of coverage are not indicated.

In order to immobilize DNA molecules, Wayner D. D. M. et al., Langmuir, 2004, 20(26) 17713-11720, have shown that it is possible to graft undecenoic acid onto a silicon surface under UV irradiation. The surface, thus ending with a carboxylic acid function, is then activated using N-hydroxysuccinimide (NHS) in the presence of N-ethyl-N'-(3-dimethylaminopropyl)carbodiimide, in order to react with a single-stranded DNA carrying a 5-dodecylamine group. The degree of coverage is not specified by the authors.

He J, et al., Chem. Phys. Lett., 1998, 286, 508-514 describe a method of functionalization according to which thiophene molecules are grafted onto an Si (111) surface. According to this method, a bromation reaction is first carried out with N-bromosuccinimide or bromochloroform, using benzoyl peroxide as free-radical initiator. A reactive surface having superficial Si—Br bonds is thus obtained. Still according to this method, an alkylation reaction is then carried out between the superficial bonds and an organolithium compound, lithiated thiophene. Thus, the thiophene is immobilized on Si via an Si—C bond. This type of surface chemistry can also be performed by carrying out a chloration of the surface, and using an organomagnesium compound in place of an organolithium compound for the alkylation reaction.

Linford et al., in Langmuir, 2005, 2093-2097, have explored the reaction of a long-chain acid chloride on specific activated silicon surfaces (scribed silicon). The authors show that acid chlorides react directly with these silicon surfaces so as to produce alkylation thereof. However, it appears that secondary reactions also take place and secondary products of the Si—C(O)—R or Si—O—C(O)—R type thus form. The operating conditions are determining in this procedure and the authors estimate that the degree of coverage is between 20% and 60%. The molecules of interest are in this case grafted onto the surface randomly. According to the grafting methods disclosed above, the surfaces are either functionalized directly with the molecules of interest, or are functionalized indirectly. In the latter case, after the anchoring of a first molecule, a secondary reaction takes place at the surface between the end function of the immobilized molecule and the end function of the molecule of interest. Among the types of secondary reactions carried out, at the surface, mention may in particular be made of hydrolysis of esters, reduction of esters and cleavage thereof, ester formation, activation of C—H end groups followed by amide or sulfonamide formation, or else polymerization. These secondary reactions are advantageous, but sometimes have moderate yields.

Upon reading the methods presented above, it appears that the grafting of molecules of interest has a certain number of drawbacks and can be further improved in particular with regard to the number of steps required for the grafting, the chemistry employed during the secondary reactions and also the variety of molecules that can be grafted.

The inventors therefore gave themselves the aim of developing a method of grafting molecules of interest onto inorganic surfaces which is effective and easy to implement, in particular in the process for the fabrication of modified surfaces, which may subsequently be used as desired by the user. The use of click chemistry, recently defined by Sharpless K. B. et al., (Angew. Chem. Int. Ed. 2001, 40, 2004-2021) has allowed the inventors to develop such a method.

In this application, the inventors therefore propose a method for covalently grafting at least one molecule to the surface of an inorganic substrate bearing at least one spacer, by carrying out a "click chemistry" reaction.

As has been fully described in the article by Sharpless K. B. et al. (mentioned above), click chemistry corresponds to the reactions which result in the formation of at least one covalent bond between a carbon atom and a heteroatom under operating conditions that are simple to use and where the presence of water or of oxygen generally has no influence on the course of the reaction. These reactions are sometimes carried out without solvent or in the presence of a nonpolluting solvent (such as water) or a solvent that can be readily eliminated. The desired product can be readily isolated and obtained with good yields, without the formation of hindering by-products. More generally, it is recognized that this type of reaction has, in addition, a motive force of greater than 20 kcal·mol$^{-1}$. In this type of reaction, the bringing together of two principal substrates, the "reactive" functions of which are complementary, effectively results in the desired product.

Among the principal click chemistry reactions, mention may in particular be made of:
cycloadditions of unsaturated species, such as 1,3-dipolar cycloadditions or reactions of Diels-Alder type (hetero Diels Alder included),
nucleophilic substitutions, in particular the opening of constrained electrophilic heterocycles such as epoxides, aziridines, aziridinium ions and episulfonium ions,
reactions on carbonyls, other than aldol chemistry, such as in particular the formation of ureas, thioureas, aromatic heterocycles, oxime ethers, hydrazones and amides,
addition reactions on multicarbon-carbon bonds, in particular oxidations, such as epoxidation, dihydroxylation, aziridination, sulfenyl halide addition and Michael additions.

Click chemistry is very widely used for functionalizing biological molecules. This is because the mild operating conditions (for example: reaction at ambient temperature using water as reaction solvent) linked to the very high yield of these reactions are very suitable for treating fragile molecules. These advantages also make one think that other molecules could also react just as well under similar conditions.

A first subject of the present invention is therefore a method for covalent grafting at least one molecule of interest to the surface of a silicon substrate comprising surface hydride functions, said substrate carrying at least one spacer, characterized in that it comprises at least the following steps:

(a) a first step of covalent anchoring, to the surface of said substrate, at least one spacer compound of general formula (I) below:

$$(X)_n\text{-E-}(Y)_m \qquad (I)$$

in which:
E represents a group chosen from alkyl and aryl radicals,
X represents a C=C double bond,
Y represents an end functional group chosen from double and triple bonds between two carbon atoms, triple bonds between a carbon atom and a nitrogen atom, aziridines, acyl chlorides and their complementary azide and amine functions, said functional group being capable of reacting with at least one complementary functional group Z carried by a molecule of interest, in a reaction resulting in the formation of a covalent bond between a carbon atom and a heteroatom belonging, respectively and indifferently, to the functional groups Y and Z (click chemistry reaction),
m and n, independently of one another, are integers between 1 and 3 inclusive, (b) a second step of covalent coupling, to said spacer compound of formula (I) thus anchored to the surface of said substrate, at least one molecule of interest by formation, according to a click chemistry reaction, of at least one covalent bond of —C-Het-type in which Het is a heteroatom, by reaction of at least one functional group Z carried by said molecule of interest and chosen from double and triple bonds between two carbon atoms, triple bonds between a carbon atom and a nitrogen atom, aziridines, acyl chlorides and their complementary azide and amine functions, and of at least one group Y of said spacer compound of formula (I), Z and Y being capable of forming, together, said covalent bond.

For the purpose of the present invention, the term "anchoring" refers to the immobilization of a spacer compound of formula (I) on a silicon surface carrying surface hydride functions, via a covalent bond. The term "coupling" describes the reaction between at least one end functional group Y (not immobilized) of the spacer compound of formula (I) and at least one complementary functional group Z of the molecule of interest. The term "grafting" describes the combination of these two actions. Thus, the molecule of interest is grafted onto the surface of the inorganic substrate subsequent to the anchoring of the spacer compound of formula (I) in accordance with the invention, followed by the coupling of the molecule of interest and of this spacer compound via a covalent bond of —C-Het-type, according to a click chemistry reaction.

According to the invention, the alkyl radical defined for E is preferably an unsubstituted or optionally mono- or polysubstituted, linear, branched or cyclic, saturated or unsaturated radical containing from 1 to 20 carbon atoms. When they are mono- or polysubstituted, the substituent(s) of these alkyl radicals is (are) preferably chosen from halogen atoms, and the following groups: hydroxyl, amino, carboxyl, $C_1$ to $C_{10}$ alkyl, and aryl, which may be substituted or unsubstituted, it being possible for said substituents to themselves contain one or more halogen atoms such as F or Cl and/or one or more heteroatoms such as N, O, P, Si and S, thus resulting, for example, in $C_1$-$C_{10}$ alkoxy groups such as, for example, methoxy and ethoxy groups; ether oxide groups; aryloxy groups; $C_1$-$C_{10}$ aminoalkyl groups; aminoaryl groups; $C_1$-$C_{10}$ hydroxyalkyl groups; hydroxyaryl groups; $C_1$-$C_{10}$ thioalkyl groups, for instance the mercapto group; cyano groups; keto groups; $C_1$-$C_{10}$ haloalkyl groups; $C_1$-$C_{10}$ heteroalkyl groups; haloaryl and heteroaryl groups.

Among such saturated and unsubstituted alkyl radicals, mention may in particular be made of methyl, ethyl, propyl, isopropyl, butyl, isobutyl, tert-butyl and pentyl radicals.

Among the unsaturated and unsubstituted alkyl radicals, mention may in particular be made of ethenyls, propenyls, isopropenyls, butenyls, isobutenyls, tert-butenyls, pentenyls and acetylenyls.

According to the invention, the aryl radical defined for E is preferably an optionally mono- or polysubstituted, aromatic or heteroaromatic carbon-based structure consisting of one or more aromatic or heteroaromatic rings, it being possible for the heteroatom(s) to be chosen from N, O, P, Si and S.

According to a specific embodiment of the invention, and when the alkyl or aryl radicals are polysubstituted, the substituents may be different than one another. Among the substituents of the alkyl and aryl radicals, mention may in particular be made of halogen atoms, alkyl groups, haloalkyl groups, substituted or unsubstituted aryl groups, substituted or unsubstituted heteroaryl groups, amino groups, cyano groups, azido groups, hydroxyl groups, mercapto groups, keto groups, carboxyl groups, ether oxide groups and alkoxy groups such as, for example, methoxy groups.

According to the invention, E is preferably chosen from alkyl and aryl radicals, more preferably from the alkyl radicals as defined above, even more particularly from $C_1$ to $C_{20}$ alkyl radicals, which are preferably unbranched, so as not to have any steric hindrance, during anchoring, with structures that are already anchored and to obtain an acceptable degree of coverage.

The grafting method according to the invention applies to semiconducting substrates of silicon comprising surface hydride functions (Si—H). Silicon wafers are readily available. The silicon surfaces are advantageously Si(100) or Si(111) surfaces.

According to a preferred embodiment of the invention, the grafting method also comprises a step of preparing the surface, prior to the anchoring of the spacer compounds of the formula (I), in order to maximize the amount of surface Si—H bonds and to reduce the eventuality of the appearance of an oxide layer. In this case, the preparation step advantageously consists in stripping the surface with a solution of a weak acid such as, for example, a solution of hydrofluoric acid. This step can be optimized by observing the infrared vibrations of the Si—H and Si—O bonds after stripping of several surfaces with hydrofluoric acid solutions of different concentrations in order to choose the concentration which gives the best result. The surfaces are then preferably rinsed with demineralized water.

The spacer compounds of general formula (I) are anchored to the surface of the substrate via at least one functional group X. Depending on the value of n, the spacer compounds of formula (I) can comprise several functional groups X. However, according to a particularly preferred embodiment of the invention, spacer compounds of formula (I) in which n=1, i.e. which comprise only one functional group X, are used in order to lessen the steric hindrance.

According to the invention, the anchoring of the spacer compounds of formula (I) on the surface of a silicon substrate during step (a) is carried out via an Si—C bond, the latter being particularly strong and stable. The anchoring step (a) is therefore a hydrosilylation reaction between the surface of a silicon substrate carrying hydride functions (—Si—H) and at least one spacer compound of formula (I) and the C=C function of the functional group(s) X. This reaction is of the free-radical type and may be initiated thermally, photochemically, electrochemically or catalytically. According to the invention, photochemical and thermal initiations are preferred; advantageously, use will be made of photochemical initiation since it involves the use of mild conditions suitable for the manipulation of heat-sensitive molecules. Moreover, this form of initiation makes it possible to use smaller amounts of product.

Preferably, the functional group Y of the spacer compounds of formula (I) represents an azide, alkyne or nitrile function.

According to the invention, the grafting method described above makes it possible to graft varied molecules of interest. Preferably, Z is a functional group carrying at least one sp-hybridized carbon, preferably a C=C group (obtained by Sonogashira coupling, for example) or a C≡N group; the functional group Z may also be an azide group, which is the preferred complementary partner in a click chemistry reaction with an alkyne or a nitrile. Advantageously, the molecule of interest carries from one to four functional groups Z, and preferably just one.

Among the complementary pairings between the functional group(s) Y of the spacer compounds of formula (I) and the functional group(s) Z of the molecules of interest, mention may therefore be made of:

alkyne or nitrile (group Y)/azide (group Z) pairings;
azide (group Y)/alkyne or nitrile (group Z) pairings.

A pairing that is particularly preferred according to the invention is the azide (group Y)/alkyne (group Z) pairing.

Among the spacer compounds of formula (I) above, mention may in particular be made of those in which:

n=1;
E represents a $C_6$ to $C_{12}$ alkyl radical;
Y represents an azide and m=1.

Among such compounds are, in particular, hexenyl azide, heptenyl azide, octenyl azide, nonadecenyl azide, decenyl azide, undecenyl azide and dodecenyl azide.

The spacer compounds of formula (I) used according to the method in accordance with the invention can be readily prepared according to the conventional methods of synthesis that can be used by those skilled in the art, for example using the methods of synthesis described by Scriven E et al. (Chemical Reviews, 1998, 88(2), 297-368) or by Alvarez S. G. et al. (Synthesis, 1997, 413-414).

According to the invention, step (b) of covalent coupling between the spacer compound of formula (I) and the molecule of interest (reaction between the groups Y and Z) is preferably a 1,3-cycloaddition reaction between a dipole, which may be, for example, an azide group $N_3$, and a dipolarophile, which may be, for example:
- either an alkyne group; in this case, the reaction results in a triazole,
- or a nitrile group; in this case, the reaction results in a tetrazole, the group Y being, in this case, preferably the dipole. When the dipolarophile is an alkyne, it is preferable for it to be at the end in order to be accessible.

The covalent coupling to the spacer, obtained in (a), of at least one molecule carrying at least one group Z can be carried out in the presence of a catalyst.

In the case of coupling by 1,3-cycloaddition, and in particular Huisgen 1,3-cycloaddition, it is recommended to use a metal catalyst, advantageously a transition metal, and in particular $Cu^I$.

Two types of alkynes and of nitrites that can be used as functional group Y or Z can in fact be distinguished.

The first type consists of dipolarophiles having an electron-withdrawing group, which are termed "activated" and which readily react with the dipole. These "activated" alkynes or nitrites can sometimes react with the azide in a virtually quantitative manner in the absence of catalysts.

The second type consists of alkynes and nitrites termed "nonactivated", for which the cycloaddition reactions, and in particular Huisgen 1,3-cycloaddition reactions, using them require prior activation through the action of a catalyst, preferably as a supplement to a base. By way of example, use may in particular be made of a cupric catalyst $Cu^I$ generated in situ, by reaction of a source of $Cu^{II}$, such as ($CuSO_4.5H_2O$), and of a base such as sodium ascorbate, which will reduce the $Cu^{II}$ to $Cu^I$. If the solvent is aqueous, this approach is preferred. In the case of nonactivated alkynes, the addition of a base is recommended in order to facilitate the loss of the alkyne proton and thus promote the initiation of the reaction. Specifically, the mechanism envisioned for this reaction involves a cycle in which the base deprotonates the alkyne and copper acetylide is then formed. The acetylide subsequently reacts with the azide. The formation of the new triazole-derived ligand is thus obtained. This new complex then loses $Cu^I$. The catalyst is regenerated and the final product is obtained.

Although click chemistry reactions, and in particular 1,3-cycloadditions, are not very sensitive to the reaction solvent, the use of polar solvents may facilitate them. Thus, the covalent coupling step (b) is preferably carried out in the presence of at least one polar solvent that can in particular be chosen from water, alcohols, acetone, acetonitrile and dimethylformamide (DMF), and mixtures thereof.

The grafting method in accordance with the present invention makes it possible to graft any type of molecule of interest comprising, naturally or after modification, at least one functional group Z as described above, and capable of reacting with at least one functional group Y of the spacer compounds of formula (I) according to the conditions specified above.

For the purpose of the present invention, the term "molecule of interest" is intended to mean any element of nanometric size, i.e. having at least one dimension on the nanometric length scale (advantageously between 1 and 100 nanometers). This element may in particular be an organic or inorganic molecule, an aggregate or a cluster, a supramolecular assembly, a nanowire, a nanocrystal, etc.

Advantageously, the molecules of interest that can be grafted according to the method of the invention are multi stable molecules, i.e. molecules that have several energy minima separated by activation barriers. Thus, the molecules of interest can pass from one state to the other reversibly or irreversibly. Among the multistable molecules of interest, mention may in particular be made of electroactive molecules which exist in several redox states, photosensitive spiropyran derivatives, photoisomerizable compounds of the azobenzene type, etc.

The molecules of interest that can thus be grafted according to the method in accordance with the invention are preferably organic molecules chosen from biomolecules such as nucleic acid molecules, for instance DNA and RNA; nucleotides; oligonucleotides; proteins; peptides; sugars or polysaccharides; porphyrins such as tetrakis[meso(4-ethynylphenyl)porphyrin, 1,10-(4-ethynylphenyl)-5,15-(4-mesityl)porphyrin and 1-(4-ethynylphenyl)-5,10,15-(4-mesityl) porphyrin), the presence of which on a surface is particularly useful in the molecular electronics field; compounds exhibiting cis-trans isomerism, such as derivatives of diarylethylenes, of spiropyrans, of spiroxazines, of fulgides or of azobenzene, the presence of which on a surface is particularly useful for the fabrication of photocontrolled molecular interrupters.

The grafting method in accordance with the invention has many advantages from the viewpoint of the prior art. In addition to the surface preparation phase, the current grafting techniques comprise a number of consequential and often laborious steps, contrary to the grafting method in accordance with the present invention, which involves only a limited number of steps.

In general, the overall degree of coverage is linked to the yields from the first anchoring step (a) and from the second coupling step (b). Given the specific nature of the support (silicon), the grafting method in accordance with the invention allows high-yield reactions to be carried out, such as the hydrosilylation of an alkene on a silicon surface, and such as Huisgen cycloaddition, which is a virtually quantitative click chemistry reaction. The overall coverage obtained is therefore very substantial.

The method which is the principal subject of the invention allows grafting onto a silicon substrate in only two steps by virtue of click chemistry. It can be adapted to various molecules carrying appropriate end functions, and makes it possible to readily graft the molecules studied onto a silicon surface. The advantages of the present invention may be exploited by companies in various fields, such as microelectronics, biotechnologies or else the environment industry. The properties of the grafted molecules will differentiate the fields interested since it is these which define the field of application conferred on the surface.

A subject of the present invention is therefore also the silicon supports comprising at least one surface functionalized with at least one molecule of interest, said supports being able to be obtained by carrying out the grafting method as defined above.

These supports are characterized in that they comprise at least one silicon surface having surface hydride functions, onto which is covalently grafted at least one molecule of interest via at least one spacer compound of formula (I) below:

$$(X)_n\text{-}E\text{-}(Y)_m \qquad (I)$$

in which X, Y, E, n and m have the same meaning as indicated above and in which the functional group(s) Y is (are) involved in a covalent bond —C-Het with at least one complementary functional group Z carried by said molecule of interest.

The collection of molecules of interest thus grafted to the surface of the support via the spacer compounds of formula (I) forms a particularly stable and robust film, in particular because the anchoring of the spacer compounds of formula (I) onto the surface of the support is provided by an Si—C bond.

These films are in the form of a monomolecular layer. In fact, certain current grafting techniques, involving free-radical reactions, result in the formation of a deposit of multilayers of molecules on the surface. It is not yet well known how to control these reactions for the purpose of restricting this deposit to a monolayer. In the context of the invention, even if the grafting of the spacer compounds of formula (I) is carried out by a free-radical reaction, the latter cannot result in the formation of a polymer. Thus, the reaction takes place only on the available superficial sites, thus resulting in the formation of a monomolecular layer.

Moreover, in the silicon surface field, the Si—O bond is normally widely used. The energies of Si—O and Si—C bonds are equivalent and therefore have an identical thermodynamic stability, but there is a difference in terms of kinetics. The Si—O bond is highly polarized and thus much more sensitive to acid hydrolysis or basic hydrolysis than the Si—C bond. Surfaces using these Si—O bonds may therefore degrade more rapidly. Moreover, the surfaces obtained by means of Si—O bonds are often less organized since they result from the reaction of a multifunctional siloxane (RSi(OR')$_3$, for example) capable of reacting with the surface, but also with another molecule in solution. It is difficult to obtain monomolecular layers with this method, and the degree of coverage may vary from one sample to another.

On the other hand, according to the invention, the support comprises a silicon surface onto which the spacer compounds of formula (I) are covalently anchored via an —Si—C bond and form a monomolecular film. This embodiment provides very good stability. Thus, the surfaces obtained may be conserved for longer without the risk of decomposition of the layer of molecules, and will not be affected by the conditions outside the device. It can be easily understood that this advantage is very important if it is desired to transfer surfaces of this type to the electronic compounds of the future.

Depending on the nature of the molecules of interest coupled to the spacer compounds of formula (I) (nucleic acids, nucleotides, oligonucleotides, proteins, peptides, sugars and polysaccharides, porphyrins, diarylethylenes, spiropyrans, spiroxazines, fulgides and azobenzenes), the support in accordance with the invention constitutes respectively a nucleic acid chip, a nucleotide chip, an oligonucleotide chip, a protein chip, a peptide chip, a sugar chip, a polysaccharide chip, a porphyrin chip, a diarylethylene chip, a spiropyran chip, a spiroxazine chip, a fulgide chip or an azobenzene chip.

The supports in accordance with the invention may advantageously be used in the fields of nanotechnology and nano-biotechnology such as electronics, in particular the molecular electronics, biotechnology and environment fields.

The use of the supports in accordance with the invention in the molecular electronics field is very advantageous since the method of the invention makes it possible to graft bistable molecules (multistable at two minima) directly onto silicon. In the majority of the examples mentioned, the molecules are anchored onto an insulating silica layer. This oxide layer will always have an important role in the behavior of the device. It is then difficult to decypher the direct relationship between the change in state of the molecule and the changes in the semiconductive properties of the silicon. Moreover, if this layer is too thick, the properties of the material will not be at all affected by the change in state of the molecules and the advantage of grafting them onto this surface will be lost. The multistable molecules grafted are often electroactive molecules which exist in several redox states or compounds having a cis-trans photoisomerization, such as derivatives of diarylethylenes, of spiropyrans, of spiroxazines, of fulgides or of azobenzene. When modified in this way, the surface should reproduce this multistability which will most commonly be advantageously converted to an electrical signal. The fabrication of surfaces of this type is advantageous for microelectronics companies in their quest for the miniaturization of the existing devices. Furthermore, in this field, the molecules are directly grafted onto silicon, which will make it possible to study the effect of the switch in state of multistable molecules on the semiconductor properties of Si. The fabrication of hybrid electronic devices, such as hybrid memories or molecular transistors, will be facilitated by these surfaces.

The simple grafting of the method which is the subject of the invention will be taken advantage of in the bioindustry field, and in particular in the preparation of nucleic acid (DNA, RNA) chips. Specifically, the intermolecular recognition between a grafted molecule and a molecule in solution may be possible to characterize by fluorescence when one of the two molecules has this property, or by a change in the semiconductive properties of the substrate when the properties of the grafted molecule are modified subsequent to the specific supramolecular interactions (hydrogen bonds, electrostatic bonds, $\pi$-$\pi$ bonds, etc.) between this molecule and that which is in solution. Thus, the invention allows the production of biochips with molecules of interest, which may be used, for example, for detecting antibodies or else for determining where damage is located on a damaged DNA strand, etc.

The supports in accordance with the invention may also be used as sensors in the environment field, in particular for searching for and/or eliminating pollutants. Specifically, receptor surfaces can be prepared according to the method in accordance with the invention in such a way that, in a certain medium, specific recognition takes place between a grafted molecule of interest and one of the various pollutants in solution. It will thus be possible to selectively detect and/or eliminate certain pollutants.

In addition to the above arrangements, the invention also includes other arrangements which will emerge from the following description, which refers to examples of synthesis of a spacer compound of formula (I) and of molecules of interest, to an example describing test cycloaddition reactions in solution between spacer compounds of formula (I) and molecules of interest and to an example of preparation of a support functionalized with a spacer compound of formula (I) coupled to a molecule of interest, and also to the attached FIGS. 1 and 2 in which.

It should be understood, however, that these examples are given only by way of illustration of the subject matter of the invention, of which they in no way constitute a limitation.

EXAMPLES

The examples which follow are carried out on silicon surfaces. It was chosen to immobilize in particular a heterocycle-derived, aromatic, electroactive molecule. It is a metalloporphyrin having four end triple bonds C≡C. Said metalloporphyrin is grafted via a spacer having an aliphatic chain of eleven carbon atoms. The click chemistry reaction carried out during the method is a cycloaddition between an alkyne group on the metalloporphyrin and the azide group of the spacer.

Example 1

Synthesis of a Spacer Compound of Formula (I): Undecenyl Azide

In this example, a spacer compound of formula (I) was prepared: the undecenyl azide of formula ($I_1$) below:

($I_1$)

To do this, sodium azide (2.781 g, 43 mmol) was dissolved in 170 ml of dimethylformamide (DMF). 5 ml of undecenyl bromide (36 mmol) were added, with stirring, to the reaction medium, which was subsequently heated at 80° C. for 24 hours. The mixture was left to cool to ambient temperature, and then 100 ml of water were added portionwise. An extraction with ethanol (3×100 ml) was subsequently carried out, and the organic phase was then washed with water (3×100 ml) and dried over sodium sulfate ($Na_2SO_4$). Finally, the solvent was evaporated off and 2.58 g of undecenyl azide (20.3 mmol; yield 60%) were isolated in the form of a pale yellow-colored transparent oil.

Example 2

Synthesis of Molecules of Interest

In this example, several molecules of interest were synthesized. They derive from a central nucleus of porphyrin type. These molecules were chosen because they are of interest in several fields of application of the invention. The porphyrin core, allowing complexation of metals, is of major interest in applications in biology or in the environmental field. Furthermore, since metalloporphyrins have several redox states, they have great potential in electronics and photoelectronics.

1) Synthesis of tetrakis(4-trimethylsilylethynylphenyl)porphyrin (protected TEPP) (1)

This molecule can be represented by formula (I) below:

(1)

5.02 g of 4-trimethylsilylethynylbenzaldehyde (25 mmol) were dissolved in 210 ml of propionic acid and then heated to 80° C. 1.72 ml of pyrrole (25 mmol) were subsequently added portionwise over a period of one hour. The temperature was subsequently increased and the mixture was kept at reflux for 4 hours. After a return to ambient temperature, 75 ml of methanol were added to the reaction medium, which was then left to stand for 14 hours in order for the porphyrin to crystallize. The medium was filtered over sintered glass and the product was rinsed with methanol. 2.87 g (3 mmol; yield 12%) of the expected porphyrin (1) were obtained in the form of a purple powder.

2) Synthesis of tetrakis(4-ethynylphenyl)porphyrin (TEPP) (2)

(2)

A solution of 700 mg (0.7 mmol) of protected TEPP (1) obtained above in 500 ml of a chloroform/tetrahydrofuran (THF) mixture (1/1 v/v) was cooled in a bath of liquid nitrogen and acetone to a temperature of between −30 and −50° C., and then a 1 mol/l solution of tetrabutylammonium fluoride (TBAF) in THF (259 mg, 0.99 mmol in 1 ml) was added to the reaction mixture, which was subsequently stirred for 20 hours. The rise in temperature was not controlled. The solvent was subsequently evaporated off and the deprotected porphyrin (2) was obtained in the form of a purple powder (747 mg, 1.05 mmol).

3) Synthesis of iron tetrakis(4-ethynylphenyl)porphyrin (FeCl-TEPP) (3)

(3)

A solution of FeCl₃.4H₂O (4.56 g; 28.13 mmol) in DMF (100 ml) was added portionwise to a solution of 1 g (1.4 mmol) of porphyrin TEPP (2), as obtained above in the preceding step, in 400 ml of DMF and the whole was refluxed for 24 hours. 10 ml of 2,6-lutidine were then added, and the reflux was taken up again for 48 hours. The heating was stopped and the solvent was evaporated off under reduced pressure. The residue was taken up in 50 ml of water and stirred in order to eliminate a maximum of salts and of TBAF, and then filtered through paper. The residue was dissolved in 100 ml of chloroform and the organic phase was washed with a saturated aqueous solution of sodium chloride (3×100 ml) in order to be sure that the axial ligand of the iron is a chlorine atom. The organic phase was subsequently dried over sodium sulfate and the solvent was evaporated off. The iron tetrakis(4-ethynylphenyl)porphyrin (FeCl-TEPP) (3) (813 mg; 1.02 mmol; yield: 73%) was obtained in the form of a powder that was purple/black in color, and brown in solution in chloroform.

4) Synthesis of cobalt tetrakis(4-ethynylphenyl)porphyrin (Co-TEPP) (4)

(4)

A solution of 8.71 g (35 mmol) of cobalt acetate tetrahydrate (Co(CH₃COO)₂.4H₂O) in 100 ml of DMF was added portionwise to a solution of 1.7 g (2.39 mmol) of porphyrin TEPP (2) as obtained above in step 2), in 500 ml of DMF. The mixture obtained was refluxed for 20 hours. The heating was stopped and 150 ml of water were added to the reaction medium. The mixture was subsequently extracted with ethanol (4×200 ml) and the organic phase was then evaporated. The residue was dissolved in 300 ml of ethanol, and the organic phase was washed with 3×200 ml of water and dried over sodium sulfate. The solvent was evaporated off and the cobalt tetrakis(4-ethynylphenyl)porphyrin (Co-TEPP) (4) (1.19 g; 1.55 mmol; yield: 65%) was obtained in the form of a powder that was purple/black in color, and red in solution in chloroform.

5) Synthesis of Manganese tetrakis(4-ethynylphenyl)porphyrin (MnCl-TEPP) (5)

(5)

A solution of 5.5 g (27.8 mmol) of manganese chloride tetrahydrate (MnCl₂.4H₂O) in 160 ml of DMF was added portionwise to a solution of 1 g (1.4 mmol) of porphyrin TEPP (2) as obtained in step 2) above and dissolved in 200 ml of DMF. The mixture was refluxed for 72 hours. After a return to ambient temperature, the solvent was evaporated off under reduced pressure. The residue was taken up in 50 ml of chloroform and the manganese salts were eliminated by filtration over celite. The liquid filtrate was evaporated and the residue was subsequently dissolved in 100 ml of ethanol and washed with 3×100 ml of water in order to eliminate the TBAF. After evaporation, the residue was dissolved in chloroform and this organic phase was in turn washed with a saturated aqueous solution of sodium chloride (3×100 ml) in order to be sure that the axial ligand of the manganese is a chlorine, and finally washed with 2×100 ml of water in order to eliminate the traces of sodium chloride. The organic phase was subsequently dried over sodium sulfate and the solvent was evaporated off. During the first extraction with ethanol and water as solvents, a part of the porphyrin precipitated. This precipitate was filtered off and kept. It was subsequently redissolved in chloroform so that it could be added to the organic phase during the washing with sodium chloride. 700 mg (0.88 mmol; yield 63%) of manganese tetrakis(4-ethynylphenyl)porphyrin (MnCl-TEPP) (5) were obtained in the form of a purple/black-colored powder which is green in solution in chloroform.

Example 3

Test Cycloaddition Reactions in Solution

These reactions were carried out in the absence of any support in order to study the reality of the formation of a bond of —C-Het type between a spacer compound of formula (I) and a molecule of interest comprising a functional group Z.

1) Synthesis of Manganese tetrakis(meso-[4-(1-hexyl [1,2,3]triazol-4/5-yl)phenyl])porphyrin (6)

(6)

A solution of copper iodide (6.7 mg; 0.035 mmol) in 60 ml of acetonitrile, then 0.09 ml of triethylamine and, finally, a solution of MnCl-TEPP (5) as obtained above in example 2, step 5) (88.7 mg; 0.11 mmol) in 120 ml of acetone were added successively, with stirring, to a solution of hexyl azide (0.157 g; 1.23 mmol) in 35 ml of water. The mixture was heated at 80° C. for approximately 3 hours and the solvent was then evaporated off. The product was obtained in the form of a black powder.

2) Synthesis of Iron tetrakis(meso-[4-(1-hexyl[1,2,3]triazol-4/5-yl)phenyl])porphyrin (7)

(7)

A solution of copper iodide (6.7 mg; 0.035 mmol) in 25 ml of acetonitrile, then 0.09 ml of triethylamine and, finally, a solution of FeCl-TEPP (3) as obtained above in example 2, step 3) (54.2 mg; 0.07 mmol) in 60 ml of acetone were added successively, with stirring, to a solution of hexyl azide (91.1 mg; 0.72 mmol) in 18 ml of water. The mixture was heated at 80° C. for approximately 6 days and the solvent was then evaporated off. The product was obtained in the form of a black powder.

3) Synthesis of Manganese tetrakis(meso-[4-(1-dodecancyl[1,2,3]triazol-4/5-yl)phenyl])porphyrin (8)

A solution of copper iodide (6 mg; 0.03 mmol) in 50 ml of acetonitrile, then 0.09 ml of triethylamine and, finally, a solution of MnCl-TEPP (5) as obtained above in example 2, step 5) (48.9 mg; 0.063 mmol) in 60 ml of acetone were added successively, with stirring, to a solution of dodecanyl azide (0.13 g; 0.63 mmol) in 35 ml of water. The mixture was heated at 80° C. for approximately 4 days and the solvent was then evaporated off. The product was obtained in the form of a black powder.

For these 3 reactions, the mass spectra (not represented) verify that the reactions were complete, and that there was no production of by-products. In order to improve the reaction times, a hindered base such as N,N-diisopropylethylenediamine (DIPEA) can be added, or else a larger amount of catalyst can be used.

We will also remark that, in the case of a porphyrin having just one reactive function, the reaction time is considerably reduced. Moreover, only one of these functions has to react with the spacer compound of formula (I) anchored onto the silicon in order for the molecule to itself be grafted to the surface. Thus, it is not necessary to react the modified surface and the porphyrin for as long a period of time as in solution.

Example 4

Preparation of a Support Functionalized with a Spacer Compound Of Formula (I) onto which a Molecule of Interest is Coupled 1) Preparation of the Silicon Surface The silicon surfaces which were used in this example are pieces of p-doped silicon Si(100) wafers, with dimensions of 2×10 cm$^2$, and with a resistivity of 14 to 22 Ω·cm. The preparation thereof and the following steps were carried out in a clean room in order to avoid any contamination. The nonoxidized silicon surface was regenerated by dipping the substrate in dilute hydrofluoric acid (5%) for a short period of time (a few tens of seconds). After rinsing with deionized water, the substrate was dried under a nitrogen stream and then conserved under an inert atmosphere. The surface obtained has superficial Si—H bonds.

2) Anchoring of a Spacer Compound of Formula (I)

This step is the first step of grafting a molecule of interest onto the silicon; it corresponds to the anchoring of the spacer compound of formula (I) onto the surface of the support. It is, in this case, a hydrosilylation reaction of free-radical type between the undecenyl azide (1) as prepared above in example 1 and the regenerated silicon surface as indicated above in 1). The substrate prepared as above in 1) was immersed in a 6% solution of undecenyl azide in mesitylene. The reaction was carried out under argon at 150° C. for 12 hours.

This reaction can be initiated catalytically, thermally, photochemically or electrochemically. In this example, the reaction was initiated thermally.

The reactions resulting in the grafting of the spacer compounds of formula (I) can be represented according to scheme A below:

SCHEME A

On this scheme, R corresponds to the part E-(Y)$_m$ of the spacer compound of formula (I).

After the initiation step, an Si—H bond loses an electron (step a)) and an Si˙ radical is thus obtained, which subsequently reacts (step b)) with the end double or triple bond of the molecule of interest to be grafted. The Si—C bond is thus formed and the C radical on the carbon in the β-position with respect to the Si will then react, during step c), with the Si—H bond of the neighboring anchoring site and produce a —CH$_2$ and an Si• radical. The propagation of the radical will be able to initiate these reactions for forming Si—C bonds on the other sites.

The substrate was subsequently rinsed successively with 200 ml of various solvents (toluene, acetone, ethanol, water). After reaction of the spacer compound of formula (I) at the surface, a surface which no longer has surface Si—H bonds, but highly reactive azide functions, is obtained.

Characterization:

The contact angle of the surface thus prepared is 68-70°. The MIR (surface multiple reflection infrared) spectra of the natural surface (natural oxide—FIG. 1: thin line), of the activated surface (5% HF) (FIG. 1: thick line and FIG. 2: thin line) and of the functionalized (N$_3$) surface (FIG. 2: thick line) were acquired and compared.

Figure 1:
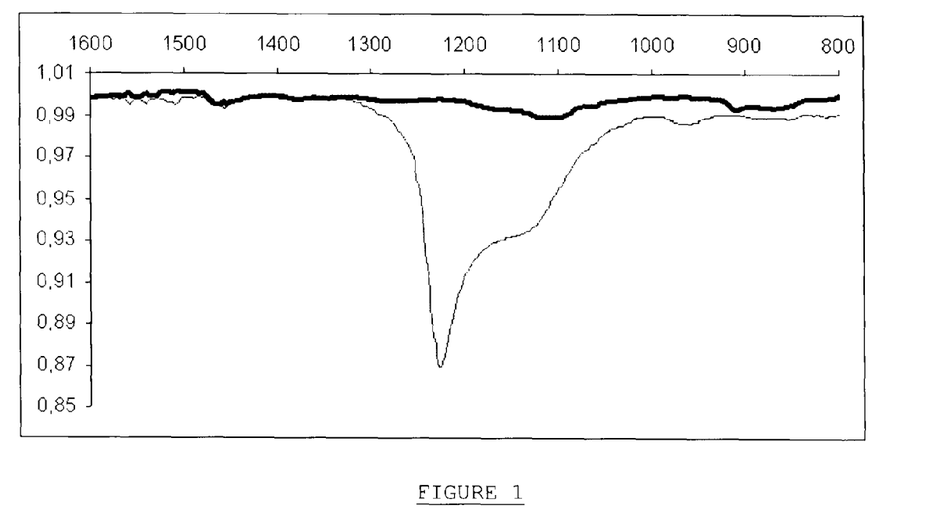
FIG. 1 represents the surface multiple reflection (MIR) infrared spectra of a natural silicon surface (thin line) and of the same surface after regeneration with hydrofluoric acid (HF) (thick line). Following this treatment, the surface has reactive —Si—H groups.
Figure 2:
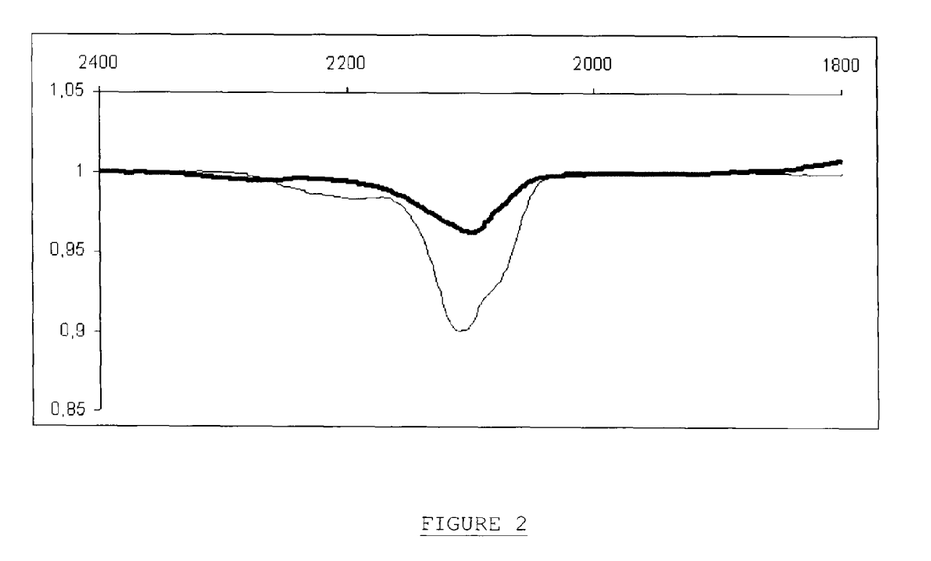
FIG. 2 represents the MIR spectra of a hydrogenated silicon surface (thin line) and of the same surface after functionalization with undecenyl azide.

The spectra are represented in FIGS. 1 and 2 respectively.

FIG. 1 represents the MIR spectra of the natural silicon surface (thin line) and of the same surface after regeneration with hydrofluoric acid (HF) (thick line); FIG. 2 represents the MIR spectra of the hydrogenated surface (thin line) and of the same surface after functionalization with undecencyl azide (thick line).

FIG. 1 clearly shows the disappearance of the natural oxide (O—H bonds, band centered at 1200 cm$^{-1}$). FIG. 2 indicates the modification of the shape of the band at 2100 cm$^{-1}$, interpreted as the disappearance of the elongation vibration of the Si—H bonds and the appearance of the elongation vibration of the end azide group.

3) Coupling of a Molecule of Interest onto the Functionalized Support by Click Chemistry Once the azide had been grafted to the surface of the support according to step 2) above, it was reacted with tetrakis (4-ethynylphenyl)porphyrin (2) as prepared above in step 2) of example 2.

Since metalloporphyrins are not water-soluble, a mixture of organic solvents was used: acetone/acetonitrile/water (10/5/3 v/v). Subsequent to the test reactions carried out entirely in solution in a homogeneous medium and as described above in example 4, the reaction was carried out in the presence of 0.1 equivalent of catalyst (Cu$^I$) and 2 equivalents of base (triethylamine or diethylisopropylamine), at 80° C. The reaction was transposed to a silicon surface and the molecules of interest were grafted onto the modified surface, which can be controlled by MIR, ATR, XPS (X-ray photoelectron spectroscopy), STM/AFM (AFM—atomic force microscopy, STM—surface tunneling microscopy) or electrochemistry.

Porphyrin chips are thus obtained which may be used, for example, as molecular memories or as gas detectors or biological substance detectors.

The invention claimed is:

1. A method for covalent grafting at least one molecule of interest to the surface of a silicon substrate comprising surface hydride functions, said substrate carrying at least one spacer, which comprises:
    (a) anchoring covalently, to the surface of said substrate, at least one spacer compound of general formula (I) below:

(X)$n$-E-(Y)$m$     (I)

in which:
        E represents a group chosen from alkyl and aryl radicals,
        X represents a C═C double bond,
        Y represents an end functional group chosen from triple bonds between two carbon atoms, triple bonds between a carbon atom and a nitrogen atom and azide groups, said functional group being capable of reacting with at least one complementary functional group Z carried by a molecule of interest, in a reaction resulting in the formation of a covalent bond between a carbon atom and a heteroatom of the functional groups Y and Z;
    Y and Z being chosen among the following pairings of functions:
    triple bonds between two carbon atoms (alkyne)/azide functions, and
    triple bonds between a carbon atom and a nitrogen atom (nitrile)/azide functions, with the proviso that when the functional group Y is the first member of the above pairings, the functional group Z is the second member and the converse,
    m and n, independently of one another, are integers between 1 and 3 inclusive, and
    (b) coupling covalently, to said spacer compound of formula (I) thus anchored to the surface of said substrate, at least one molecule of interest by formation, according to a click chemistry reaction, of at least one covalent bond of —C-Het-type in which Het is a heteroatom, by reaction of at least one functional group Z carried by said molecule of interest and chosen from triple bonds between two carbon atoms, triple bonds between a carbon atom and a nitrogen atom and azide functions, and of at least one group Y of said spacer compound of formula (I), Z and Y being capable of forming, together, said covalent bond;

Y and Z being chosen among the following pairings of functions:
triple bonds between two carbon atoms (alkyne)/azide functions, and
triple bonds between a carbon atom and a nitrogen atom (nitrile)/azide functions, with the proviso that when the functional group Y is the first member of the above pairings, the functional group Z is the second member and the converse.

2. The method as claimed in claim 1, wherein the alkyl radical defined for E is an unsubstituted or mono- or polysubstituted, linear, branched or cyclic, saturated or unsaturated radical containing from 1 to 20 carbon atoms and wherein when the alkyl radical defined for E is mono- or polysubstituted, the substituent is an unsubstituted, saturated, $C_1$-$C_4$ alkyl chain optionally comprising a heteroatom or an aromatic group.

3. The method as claimed in claim 1, wherein E is an unbranched $C_1$ to $C_{20}$ alkyl radical.

4. The method as claimed in claim 1, wherein the method further comprises stripping the surface with a solution of a weak acid.

5. The method as claimed in claim 1, wherein the compounds of formula (I) are chosen from those in which n=1.

6. The method as claimed in claim 1, wherein in the spacer compounds of formula (I):
n=1;
E represents a $C_6$ to $C_{12}$ alkyl radical;
Y represents an azide and m=1.

7. The method as claimed in claim 1, wherein the spacer compounds of formula (I) are selected from the group consisting of hexenyl azide, heptenyl azide, octenyl azide, nonadecenyl azide, decenyl azide, undecenyl azide and dodecenyl azide.

8. The method as claimed in claim 1, wherein the covalent coupling between the spacer compound of formula (I) and the molecule of interest is a 1,3-cycloaddition reaction between a dipole and a dipolarophile in the presence of a metal catalyst.

9. The method as claimed in claim 1, wherein the covalent coupling is carried out in the presence of at least one polar solvent selected from the group consisting of water, alcohols, acetone, acetonitrile and dimethylformamide, and mixtures thereof.

10. The method as claimed in claim 1, wherein the molecules of interest are chosen from multistable molecules.

11. The method as claimed in claim 10, wherein the molecules of interest are organic molecules selected from the group consisting of nucleic acid molecules, nucleotides, oligonucleotides, proteins, peptides, sugars or polysaccharides, porphyrins and compounds having a cis-trans photoisomerization.

12. The method as claimed in claim 11, wherein the compounds having a cis-trans photoisomerization are selected from the group consisting of derivatives of diarylethylenes, of spiropyrans, of spiroxazines, of fulgides and of azobenzene.

13. A support functionalized with at least one molecule of interest which is obtained according to the grafting method as defined in claim 1, wherein said support comprises at least one silicon surface, having surface hydride functions, onto which is covalently grafted at least one molecule of interest via at least one spacer compound of formula (I) below:

$$(X)_n\text{-E-}(Y)_m \qquad (I)$$

in which X, Y, E, n and m have the same meaning as that indicated in claim 1, and in which the functional group(s) Y is (are) involved in a —C-Het covalent bond with at least one complementary functional group Z carried by said molecule of interest.

14. The support as claimed in claim 13, wherein the collection of molecules of interest grafted to the surface of the support via the spacer compounds of formula (I) forms a film that is in the form of a monomolecular layer.

15. The support as claimed in claim 14, wherein the molecules of interest are selected from the group consisting of nucleic acids, nucleotides, oligonucleotides, proteins, peptides, sugars and polysaccharides, porphyrins, diarylethylenes, spiropyrans, spiroxazines, fulgides and azobenzenes, and in that it constitutes respectively a nucleic acid chip, a nucleotide chip, an oligonucleotide chip, a protein chip, a peptide chip, a sugar chip, a polysaccharide chip, a porphyrin chip, a diarylethylene chip, a spiropyran chip, a spiroxazine chip, a fulgide chip or an azobenzene chip.

16. A method for producing hybrid electronic devices comprising adhering the support as claimed in claim 13 to a silica layer.

17. A method for producing nucleic acid chips comprising incorporating the support as claimed in claim 13 into a biochip.

18. A method for producing environmental sensors comprising preparing receptor surfaces with the support as claimed in claim 13, wherein a grafted molecule of interest in the support selectively recognizes pollutants.

* * * * *